(12) United States Patent
Suzuki

(10) Patent No.: US 9,786,380 B2
(45) Date of Patent: Oct. 10, 2017

(54) SEMICONDUCTOR MEMORY DEVICE

(71) Applicant: Toshiba Memory Corporation, Tokyo (JP)

(72) Inventor: Shinji Suzuki, Sagamihara Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/233,651

(22) Filed: Aug. 10, 2016

(65) Prior Publication Data
US 2017/0076815 A1    Mar. 16, 2017

(30) Foreign Application Priority Data
Sep. 10, 2015    (JP) .................. 2015-178579

(51) Int. Cl.
| | |
|---|---|
| G11C 16/26 | (2006.01) |
| G11C 16/34 | (2006.01) |
| G11C 16/10 | (2006.01) |
| G11C 16/04 | (2006.01) |
| G11C 16/08 | (2006.01) |
| G11C 11/56 | (2006.01) |
| G11C 16/24 | (2006.01) |

(52) U.S. Cl.
CPC ...... G11C 16/3459 (2013.01); G11C 11/5628 (2013.01); G11C 16/0466 (2013.01); G11C 16/0483 (2013.01); G11C 16/08 (2013.01); G11C 16/10 (2013.01); G11C 16/24 (2013.01); G11C 16/3481 (2013.01); *G11C 2211/5621* (2013.01)

(58) Field of Classification Search
CPC . G11C 16/10; G11C 16/0466; G11C 16/3459; G11C 2211/5621; G11C 16/3481; G11C 16/24; G11C 16/0483
USPC ..................................... 365/185.22
See application file for complete search history.

(56) References Cited

U.S. PATENT DOCUMENTS

| | | | |
|---|---|---|---|
| 6,856,552 B2 | 2/2005 | Takahashi | |
| 8,179,720 B2 | 5/2012 | Fukuda et al. | |
| 8,854,878 B2 | 10/2014 | Honma | |
| 2001/0040823 A1* | 11/2001 | Roohparvar | G11O 5/143 365/185.18 |
| 2003/0147278 A1* | 8/2003 | Tanaka | G11C 11/5628 365/185.03 |
| 2005/0002258 A1* | 1/2005 | Iwase | B82Y 10/00 365/222 |

(Continued)

FOREIGN PATENT DOCUMENTS

| | | |
|---|---|---|
| JP | 2003-173690 A | 6/2003 |
| JP | 2010-225225 A | 10/2010 |

*Primary Examiner* — Khamdan Alrobaie
*Assistant Examiner* — Xiaochun L Chen
(74) *Attorney, Agent, or Firm* — Patterson & Sheridan, LLP

(57) ABSTRACT

A semiconductor memory device includes a memory cell includes a charge storage layer, a word line that is connected to a gate of the memory cell, and a controller that performs a write operation on the memory cell by applying a write voltage to the word line, and a verify operation to verify a threshold voltage of the memory cell after the write operation. The verify operation includes a first verify operation using a first verify voltage, and a second verify operation using a second verify voltage higher than the first verify voltage.

14 Claims, 12 Drawing Sheets

(56) References Cited

U.S. PATENT DOCUMENTS

2014/0340964 A1* 11/2014 Shiino .................. G11C 16/26
  365/185.03

* cited by examiner

SINCE Vcg1 IS LOW,
CHANNEL IS NOT FORMED

CHANNEL IS FORMED

TRAPPED ELECTRONS HINDER
FORMATION OF CHANNEL

SINCE Vcg4 IS
SUFFICIENTLY HIGH,
CHANNEL IS FORMED

| VERIFY DETERMINATION (Multi-level verify) |
| --- |
| Case 1-1 : "IdL ≧ Ijudge" & "Id ≧ Ijudge" → CONTINUE WRITING |
| Case 1-2 : "IdL < Ijudge" & "Id ≧ Ijudge" → CONTINUE WRITING |
| Case 1-3 : "IdL ≧ Ijudge" & "Id < Ijudge" → CONTINUE WRITING |
| Case 1-4 : "IdL < Ijudge" & "Id < Ijudge" → END WRITING |

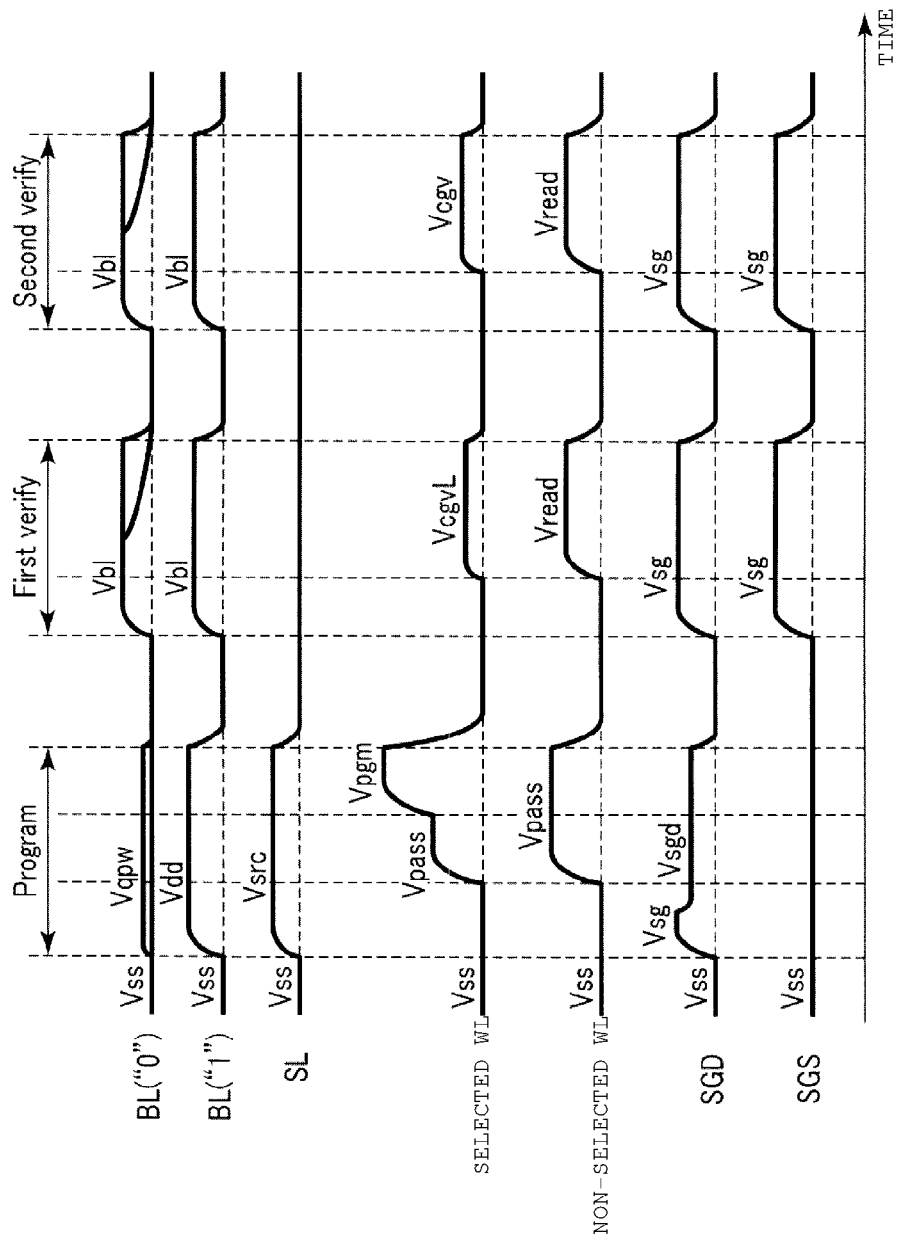

FIG. 16

VERIFY DETERMINATION (Multi-level verify + QPW)

Case 2-1: "IdL $\geq$ Ijudge" & "Id $\geq$ Ijudge" → CONTINUE WRITING

Case 2-2: "IdL $<$ Ijudge" & "Id $\geq$ Ijudge" → CONTINUE WRITING (QPW MODE)

Case 2-3: "IdL $\geq$ Ijudge" & "Id $<$ Ijudge" → CONTINUE WRITING

Case 2-4: "IdL $<$ Ijudge" & "Id $<$ Ijudge" → END WRITING

FIG. 17

VERIFY DETERMINATION (Multi-level verify + QPW)

Case 3-1: "IdL $\geq$ Ijudge" & "Id $\geq$ Ijudge" → CONTINUE WRITING

Case 3-2: "IdL $<$ Ijudge" & "Id $\geq$ Ijudge" → CONTINUE WRITING (QPW MODE)

Case 3-3: "IdL $\geq$ Ijudge" & "Id $<$ Ijudge" → CONTINUE WRITING (QPW MODE)

Case 3-4: "IdL $<$ Ijudge" & "Id $<$ Ijudge" → END WRITING

10

SEMICONDUCTOR MEMORY DEVICE

CROSS-REFERENCE TO RELATED APPLICATION

This application is based upon and claims the benefit of priority from Japanese Patent Application No. 2015-178579, filed Sep. 10, 2015, the entire contents of which are incorporated herein by reference.

FIELD

Embodiments described herein relate generally to a semiconductor memory device.

BACKGROUND

Generally, a NAND flash memory is known as a type of a semiconductor memory device.

DESCRIPTION OF THE DRAWINGS

FIG. 15 is a timing chart of the writing operation performed on the memory device, according to a second embodiment.

FIG. 16 is a diagram of a verify operation according to the second embodiment.

FIG. 17 is a diagram of a verify operation according to a modification of the second embodiment.

DETAILED DESCRIPTION

Embodiments provide a semiconductor memory device capable of improving reliability of data stored therein.

In general, according to one embodiment, a semiconductor memory device includes a memory cell that includes a charge storage layer, a word line that is connected to a gate of the memory cell, and a controller that performs a write operation on the memory cell by applying a write voltage to the word line, and a verify operation to verify a threshold voltage of the memory cell after the write operation. The verify operation includes a first verify operation using a first verify voltage, and a second verify operation using a second verify voltage higher than the first verify voltage.

Hereinafter, embodiments will be described with reference to the drawings.

A semiconductor memory device according to the present embodiment is a non-volatile semiconductor memory capable of electrically rewriting data, and a NAND flash memory will be described as an example of a semiconductor memory device, in the following embodiments.

1. First Embodiment

1-1. Configuration of NAND Flash Memory

Figure 1:
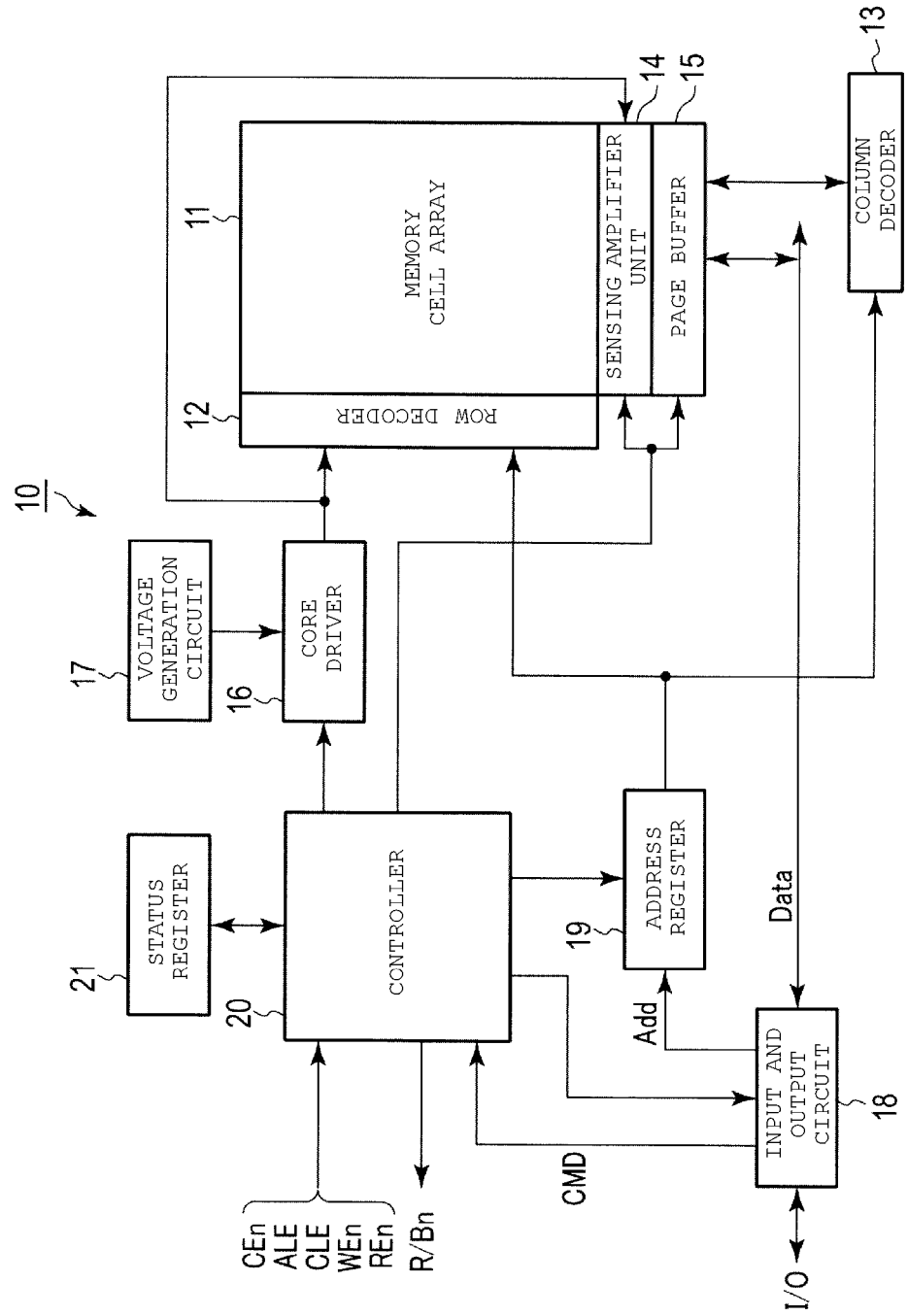
FIG. 1 is a block diagram of a memory device according to a first embodiment.

The configuration of a NAND flash memory 10 will be described with reference to FIG. 1. The NAND flash memory 10 includes a memory cell array 11, a row decoder 12, a column decoder 13, a sense amplifier unit 14, a page buffer (data cache) 15, a core driver 16, a voltage generation circuit 17, an input and output circuit 18, an address register 19, a controller 20, and a status register 21.

The memory cell array 11 includes multiple blocks, and each of the multiple blocks includes multiple memory cell transistors MT (sometimes simply referred to as a memory cell). The memory cell transistor MT includes an electrically rewritable EEPROM cell. Multiple bit lines, multiple word lines, and a source line are arranged in the memory cell array 11 in order to control a voltage applied to the memory cell transistor MT. The details of the memory cell array 11 will be described later.

The row decoder 12 receives a block address signal and a row address signal from the address register 19, and selects any one word line in the corresponding block, based on these signals. The column decoder 13 receives a column address signal from the address register 19, and selects any one bit line based on the column address signal.

The sense amplifier unit 14 senses and amplifies data from the memory cell through the bit line during data reading. Further, the sense amplifier unit 14 transfers write data to the memory cell through the bit line during data writing. Data reading from and data writing to the memory cell array 11 are performed for a unit of multiple memory cells, referred to as a page.

The page buffer 15 holds the data in units of pages. During data reading, the page buffer 15 temporarily holds data that is transferred in units of pages from the sense amplifier unit 14, and transfers the data to the input and output circuit in series. During data writing, the page buffer 15 temporarily holds data that is transferred from the input and output circuit 18 in series, and transfers the data to the sense amplifier unit 14 in units of pages.

The core driver 16 supplies a voltage required for data writing, reading, and erasing to the row decoder 12, the sense amplifier unit 14, a source line driver (not illustrated), and the like. The voltage supplied by the core driver 16 is applied to the memory cell (specifically, a word line, a select gate line, a bit line, and a source line), through the row decoder 12, the sense amplifier unit 14, and the source line driver. The voltage generation circuit 17 generates an internal voltage required for respective operations (for example, a voltage obtained by boosting the power supply voltage), and supplies the internal voltage to the core driver 16.

The controller 20 controls the overall operations of the NAND flash memory 10. The controller 20 receives various external control signals, for example, a chip enable signal CEn, an address latch enable signal ALE, a command latch enable signal CLE, a write enable signal WEn, and a read enable signal REn from an external host device (e.g., a memory controller which is not illustrated).

The controller 20 identifies an address Add and a command CMD that are supplied from the input and output terminal I/O, based on these external control signals. Then, the controller 20 transfers the address Add to the column decoder 13 and the row decoder 12 through the address register 19. Further, the controller 20 decodes the command CMD. The controller 20 performs each sequence control of data reading, writing, and erasing, in response to the external control signal and the command CMD. Further, since the controller 20 notifies the host device of the operation state of the NAND flash memory 10, a ready/busy signal R/Bn is output. The host device can recognize the state of the NAND flash memory 10 by receiving the ready/busy signal R/Bn.

The input and output circuit 18 exchanges data (including the command CMD, the address Add, and data) with the host device, through a NAND bus.

The status register 21 temporarily holds, for example, management data that is read from a ROM fuse of the memory cell array 11 during power-on. Further, the status register 21 temporarily holds various data required for the operation of the memory cell array 11. The status register 21 includes, for example, an SRAM.

1-1-1. Configuration of Memory Cell Array 11

Figure 2:
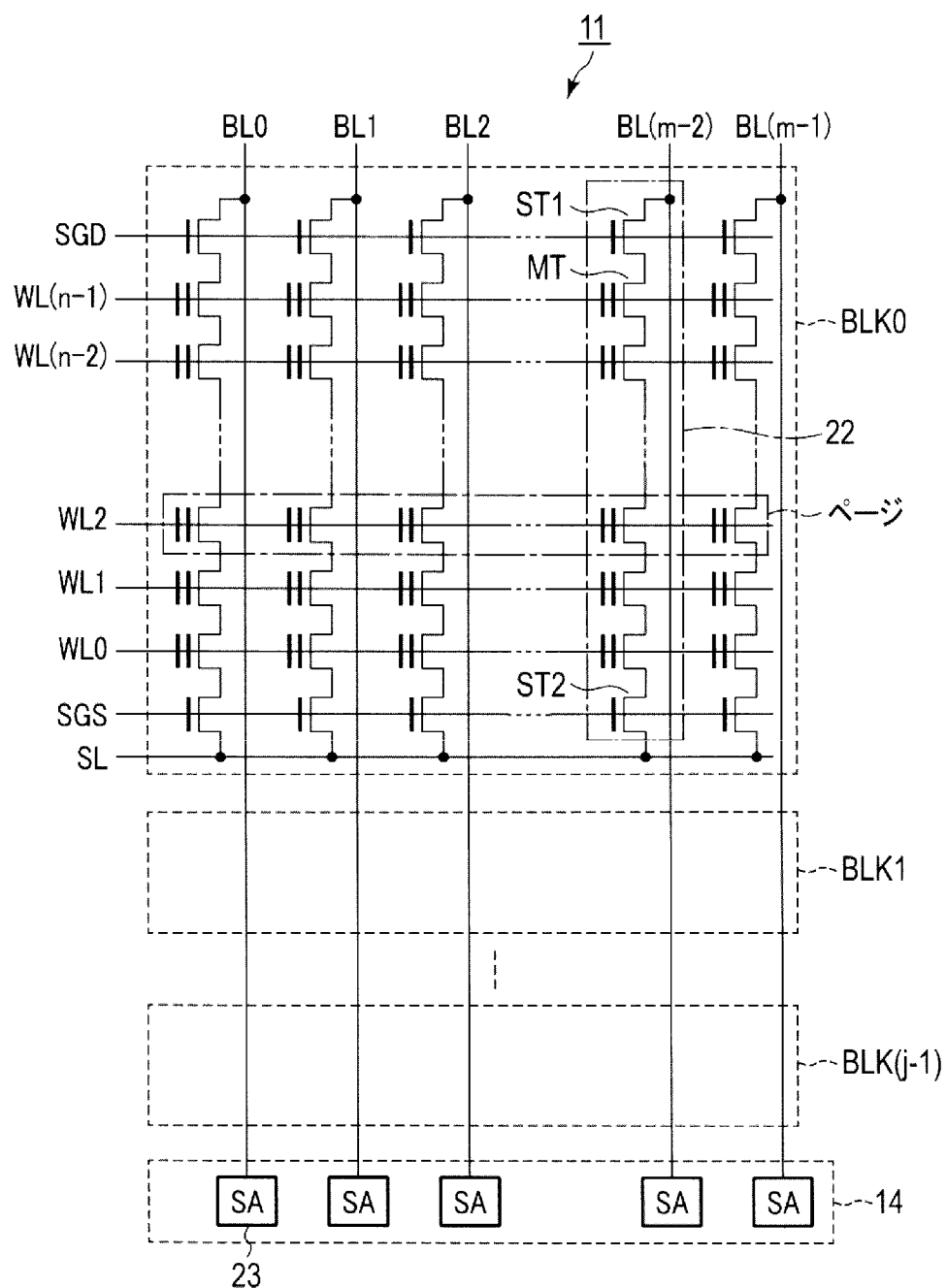
FIG. 2 is a circuit diagram of a memory cell array illustrated in FIG. 1.

The configuration of the memory cell array 11 will be described with reference to FIG. 2. The memory cell array 11 includes multiple blocks BLK (block BLK0 to BLK(j−1), where "j" is an integer of 1 or more). Each of the multiple blocks BLK includes multiple NAND strings 22.

Each of the multiple NAND strings 22 includes multiple (n) memory cell transistors MT, and two select transistors ST1, ST2, where "n" is an integer of 1 or more. The memory cell transistor MT includes a stacked gate including a control gate electrode and a charge storage layer (for example, a floating gate electrode), and stores data in a non-volatile manner. The number of memory cell transistors MT included in a single NAND string 22 can be set arbitrarily, and can be set as, for example, 8, 16, 32, 64, or 128. Multiple memory cell transistors MT are arranged such that these current paths are connected in series, between the select transistors ST1, ST2. The current path of the memory cell transistors MT on one end side of the serial connection is connected to one end of the current path of the select transistor ST1, and the current path of the memory cell transistors MT on the other end side of the serial connection is connected to one end of the current path of the select transistor ST2.

The gates of multiple select transistors ST1 included in the same block BLK are connected in common to a select gate line SGD, and the gates of multiple select transistors ST2 included in the same block BLK are connected in common to a select gate line SGS. The control gates of multiple memory cell transistors MT in the same row are connected in common to one of multiple word lines WL (WL0 to WL(n−1)).

The other ends of the current paths of the select transistors ST1 included in multiple NAND strings 22 are connected to one of multiple bit lines BL (BL0 to BL (m−1), where "m" is an integer of 1 or more. In addition, the other ends of the select transistors ST1 in the same column position across multiple blocks BLK are connected in common to one of the bit lines BL. In other words, a single bit line BL is connected in common to the NAND strings 22 which are in the same column, across multiple blocks BLK. In addition, multiple sense amplifiers (SA) 23 included in the sense amplifier unit 14 are respectively connected to the bit lines BL. The other ends of the current paths of multiple select transistor ST2 included in the same block BLK are connected in common to the source line SL. The source line SL is connected in common to, for example, the NAND strings 22 in multiple blocks.

The data of multiple memory cell transistors MT which are in the same block BLK are collectively erased. The data reading and writing are collectively performed for multiple memory cell transistors MT which are arranged in a single block BLK, and connected in common to one word line WL. The data unit of reading and writing is referred to as a page.

1-1-2. Threshold Voltage of Memory Cell Transistor MT

An example of threshold voltage distribution of the memory cell transistor MT will be described with reference to FIG. 3. For simplicity, the memory cell transistor MT is assumed to be capable of storing one bit data.

The memory cell transistor MT stores one bit data according to the threshold voltage thereof. The threshold voltage of the memory cell transistor MT can be set as either "E" level or "A" level, and has a relationship of ""E" level<"A" level". For example, "E" level is associated with data "1", and "A" level is associated with data "0".

The "E" level corresponds to a threshold voltage in a state where charges in the charge storage layer of the memory cell transistor MT are withdrawn and data is erased, and has, for example, a negative value. The "A" level corresponds to a threshold voltage in a state where charges are injected into the charge storage layer, and has, for example, a positive value.

When writing data "0" to the memory cell transistor MT, a write operation and a verify operation are repeated for the memory cell transistor MT until the threshold voltage of the memory cell transistor MT is at the "A" level. The write operation is an operation of injecting charges to the charge storage layer of the memory cell transistor MT by applying a write voltage to the word line WL. The verify operation is an operation of verifying the threshold voltage of the memory cell transistor MT by applying a verify voltage to the word line WL. When the memory cell transistor MT is in an OFF state (in other words, the threshold voltage of the memory cell transistor MT is greater than the verify voltage Vcgv), the verify operation is determined to have passed. In contrast, when the memory cell transistor MT is in the ON state (in other words, the threshold voltage of the memory cell transistor MT is at the verify voltage Vcgv or less), the verify operation is determined to have failed.

In addition, when reading data from the memory cell transistor MT, a read voltage VR which is an intermediate voltage between "E" level and "A" level is applied to the word line WL, and whether the memory cell transistor MT is in an ON state or an OFF state at this time is determined. With respect to a non-selected memory cells which are not to be read, a read pass voltage Vpass which is higher than the "A" level is applied to the word line. The read pass voltage Vpass is a voltage that turns on the non-selected memory cell, regardless of the data held in (i.e., the threshold voltage level of) the memory cell transistor MT. The handling of the non-selected memory cell is same in the verify operation.

Figure 3:
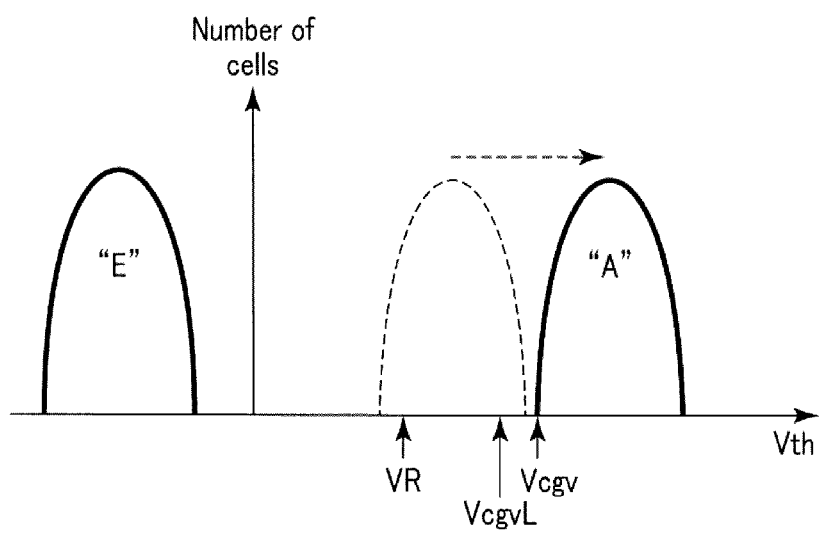
FIG. 3 is a diagram of a threshold voltage distribution of a memory cell transistor.

Although FIG. 3 illustrates an example in which the memory cell transistor MT stores one bit data, the memory cell transistor MT may store data of two bits or more. In this case, threshold levels which are higher than the "A" level are set, and the same operations as in the "A" level described above are applied to the higher threshold levels.

1-1-3. Characteristics of Memory Cell Transistor MT

Figure 4:
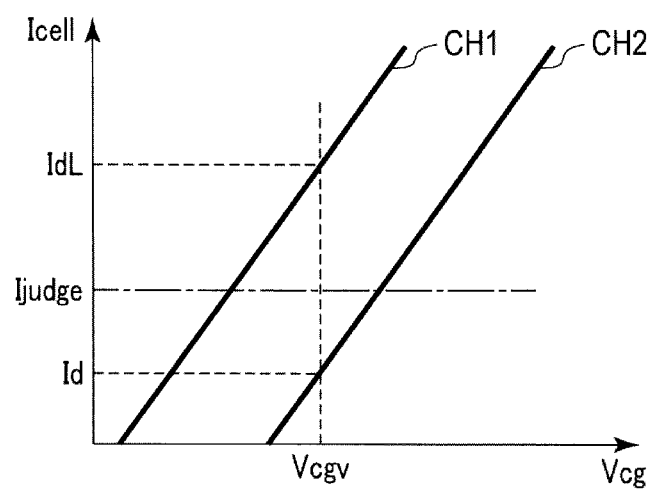
FIG. 4 is a graph of an I-V characteristic of one type of the memory cell transistor.

Next, the characteristics of the memory cell transistor MT will be described. FIG. 4 is a graph of the I-V characteristic (current-voltage characteristics) of the memory cell transistor MT. The vertical axis of FIG. 4 represents a cell current Icell flowing through the memory cell transistor MT, and the horizontal axis of FIG. 4 represents a gate voltage Vcg applied to control gate electrode of the memory cell transistor MT.

The I-V characteristic 1 (CH1) illustrated in FIG. 4 is the I-V characteristic of the memory cell transistor MT in the case where the threshold voltage of the memory cell transistor MT is the verify voltage Vcgv or less (in other words, in the case where the verify operation has failed). The I-V characteristic 2 (CH2) illustrated in FIG. 4 is the I-V characteristic of the memory cell transistor MT in the case where the threshold voltage of the memory cell transistor MT is higher than the verify voltage Vcgv (in other words, in the case where verify operation has passed).

Whether or not the verify operation has passed is determined using a certain determination current Ijudge. When the verify operation has failed, the memory cell transistor MT is in an ON state, and the cell current Icell at this time is greater than the determination current Ijudge. When the verify operation has passed, the memory cell transistor MT is in an OFF state, the cell current Icell at this time is smaller than the determination current Ijudge. In addition, in the following description, the case where the cell current Icell is greater than the determination current Ijudge may be represented as "cell current Icell flows", and the case where the cell current Icell is smaller than the determination current Ijudge may be represented as "cell current Icell does not flow."

Figure 5:
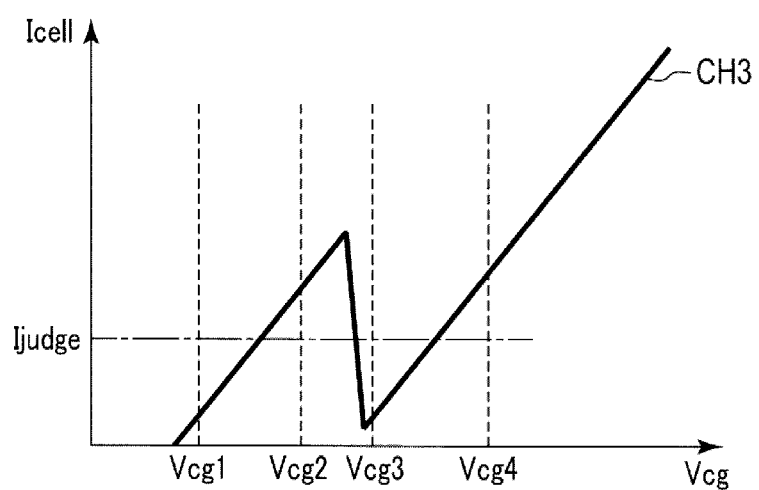
FIG. 5 is a graph of an I-V characteristic of another type of the memory cell transistor.

FIG. 5 is a graph of the I-V characteristic of a memory cell transistor MT according to another example. The I-V characteristic 3 (CH3) illustrated in FIG. 5 is the I-V characteristic of the memory cell transistor MT having a current noise due to charges (electrons) which are trapped in the gate insulating film.

The states of the memory cell transistor MT when the gate voltages Vcg1, Vcg2, Vcg3, and Vcg4 in an ascending order are applied to the memory cell transistor MT will be specifically described, with reference to FIG. 6 to FIG. 9. The memory cell transistor MT includes a source region 30 and a drain region 31 which are provided apart from each other in the semiconductor substrate, and a gate insulating film 32, a floating gate electrode 33, an inter-gate insulating film 34, and a control gate electrode 35, which are stacked above the semiconductor substrate in that order between the source region 30 and the drain region 31.

Figure 6:
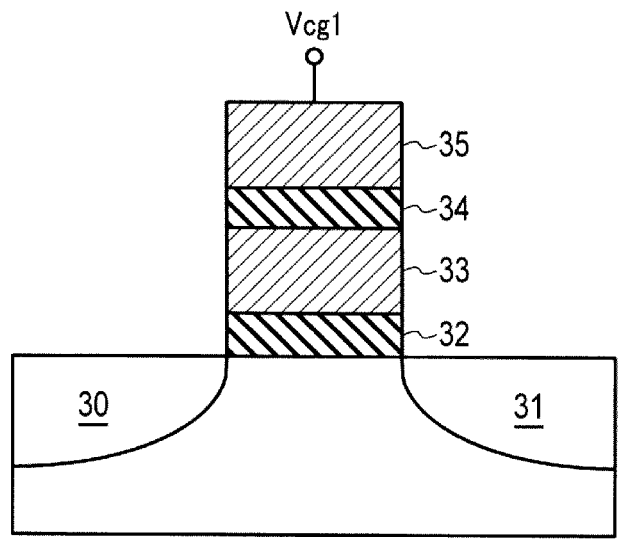
FIG. 6 is a diagram illustrating a state of the memory cell transistor when a low gate voltage is applied.

As illustrated in FIG. 6, when a gate voltage Vcg1 is applied to the memory cell transistor MT, the gate voltage Vcg1 is sufficiently low, such that a channel is not formed in the memory cell transistor MT. Thus, as illustrated in FIG. 5, the cell current Icell is smaller than the determination current Ijudge.

Figure 7:
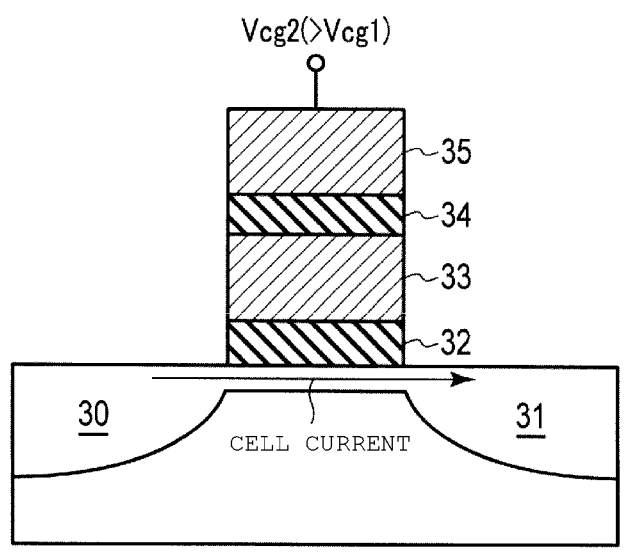
FIG. 7 is a diagram illustrating a state of the memory cell transistor when a first intermediate gate voltage is applied.

As illustrated in FIG. 7, when a gate voltage Vcg2 (>Vcg1) is applied to the memory cell transistor MT, a channel is formed in the memory cell transistor MT, and a cell current flows through the memory cell transistor MT. Thus, as illustrated in FIG. 5, the cell current Icell is greater than the determination current Ijudge. Thus, when performing the verify operation using the gate voltage Vcg2, the memory cell transistor MT in FIG. 7 fails the verify operation.

Figure 8:
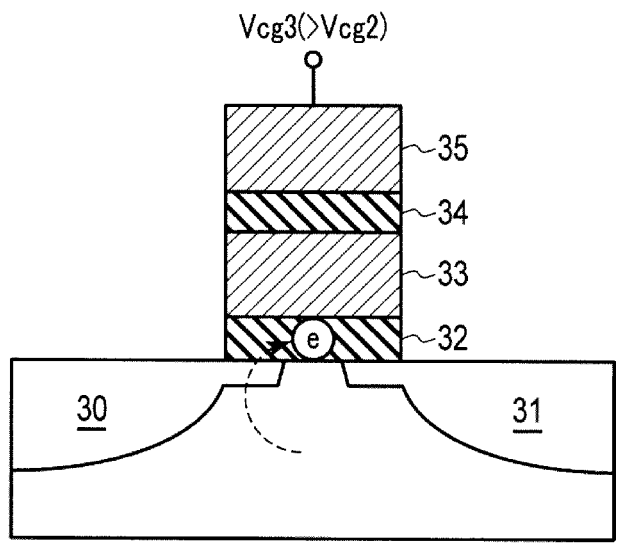
FIG. 8 is a diagram illustrating a state of the memory cell transistor when a second intermediate gate voltage is applied.

As illustrated in FIG. 8, when a gate voltage Vcg3 (>Vcg2) is applied to the memory cell transistor MT, there are cases where electrons from the semiconductor substrate are trapped in the gate insulating film 32. In this case, the trapped electrons hinder the formation of a channel. In this case, as illustrated in FIG. 5, the cell current Icell is smaller than the determination current Ijudge. In other words, the memory cell transistor MT, which was determined as having failed the verify operation, is now determined to have passed the verify operation.

Figure 9:
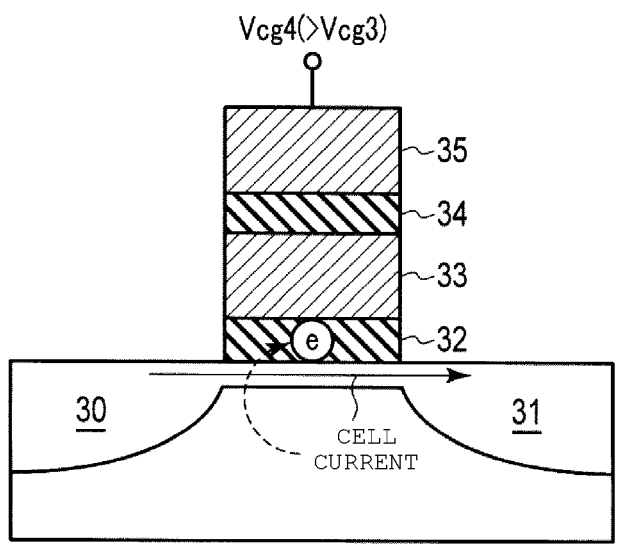
FIG. 9 is a diagram illustrating a state of the memory cell transistor when a high gate voltage is applied.

As illustrated in FIG. 9, when a gate voltage Vcg4 (>Vcg3) is applied to the memory cell transistor MT, the gate voltage Vcg4 is sufficiently high, such that a channel is formed in the memory cell transistor MT, regardless of the trapped electrons, and a cell current Icell flows to the memory cell transistor MT. Thus, as illustrated in FIG. 5, the cell current Icell is greater than the determination current Ijudge.

In this way, when using a certain verify voltage, the memory cell transistor MT having the I-V characteristic CH3 of FIG. 5 may be determined to have passed the verify operation erroneously, and thus it is necessary to take measures against this case. In the present embodiment, it is assumed only the memory cell transistor MT having the characteristics 2 (CH2) of FIG. 4 is determined to have passed the verify operation. The specific operation will be described in detail, later.

1-2. Operation of NAND Flash Memory 10

Figure 10:
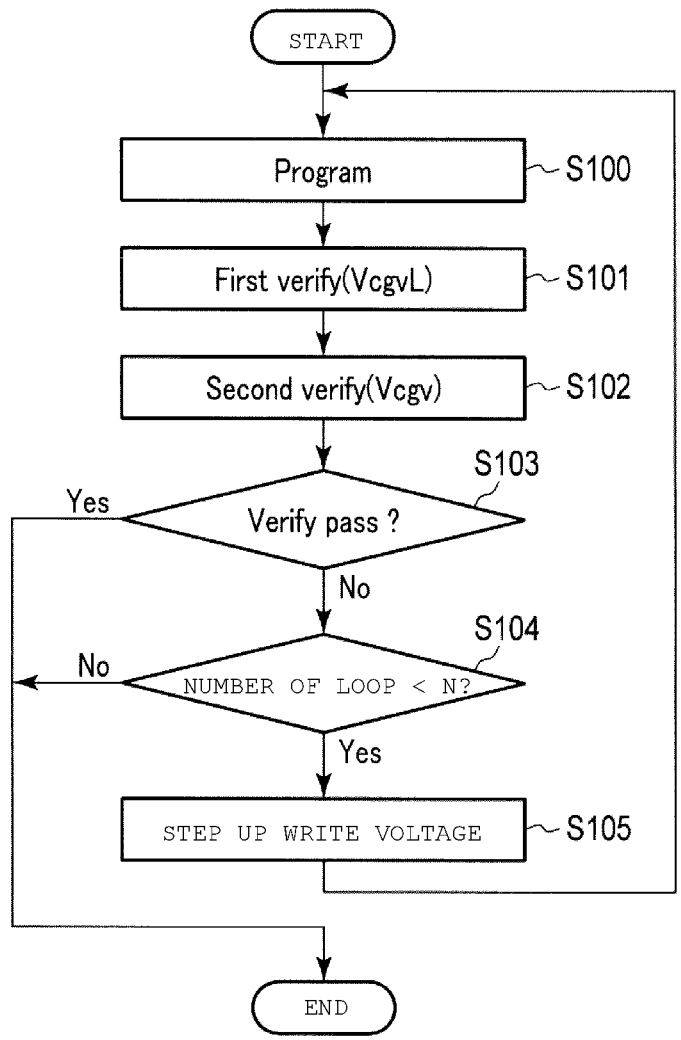
FIG. 10 is a flow chart of a writing operation performed on the memory device according to the first embodiment.

The operation on the writing of the NAND flash memory 10 will be described with reference to FIG. 10. In the present embodiment, a series of processes including a write operation applying a write voltage to the word line WL and a verify operation subsequent to the write operation is referred to as a write loop.

Figure 11:
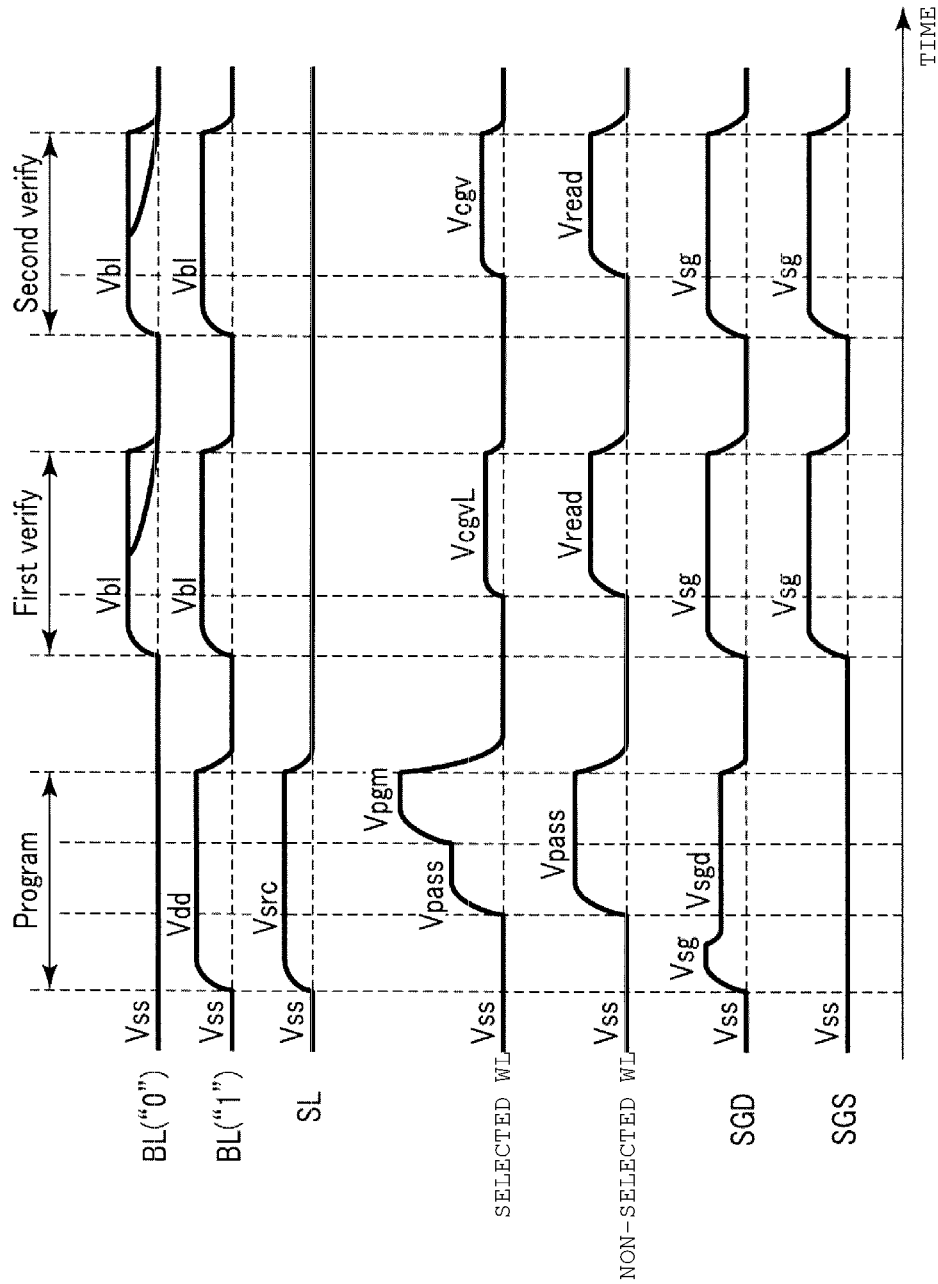
FIG. 11 is a timing chart of the writing operation performed on the memory device, according to the first embodiment.

The controller 20 executes a write operation (is also referred to as a program operation) on a page which is a writing target (selected page) (step S100). The write operation is performed as follows. As illustrated in FIG. 11, the sense amplifier unit 14 applies a ground voltage Vss (0 V) to a bit line BL ("0") connected to a memory cell transistor (a memory cell transistor which is a writing target) to which data "0" is written, and applies for example, a power supply voltage Vdd (for example, 3 V) to the bit line BL("1") connected to a memory cell transistor (non-writing memory cell transistor) to which data "1" is written. A voltage Vsrc (for example, 1.5 V) is applied to the source line SL, by a source line driver (not illustrated).

Subsequently, the row decoder 12 applies the voltage Vsg (for example, 4.5 V) to the select gate line SGD, and applies the ground voltage Vss to the select gate line SGS, in the selected block BLK. Thus, the select transistor ST1 is in an ON state, and the select transistor ST2 is in an OFF state. As a result, the voltage of the bit line is transferred to the channel of the NAND string 22. Subsequently, the row decoder 12 applies a voltage Vsgd to the select gate line SGD. The voltage Vsgd is a voltage that causes the select transistor ST1 connected to the bit line BL ("0") to be in an ON state, and the select transistor ST1 connected to the bit line BL ("1") to be in a cut-off state.

Subsequently, the row decoder 12 applies a write voltage Vpgm of a high voltage to the selected word line, and applies a non-write voltage Vpass (<Vpgm) to the non-selected word line. The non-write voltage Vpass is a voltage preventing erroneous writing to the non-selected memory cell transistor, while causing the memory cell transistor to be in an ON state, regardless of the threshold voltage of the memory cell transistor. Thus, a voltage difference between the word line and the channel is increased in the memory cell transistor which is a writing target, and data "0" is written therein. Meanwhile, a voltage difference between the word line and the channel is not increased in the non-writing memory cell transistor, and writing is not performed (write-protected) therein.

Subsequently, the controller 20 performs the verify operation twice on the selected page, including a first verify operation using the verify voltage VcgvL, and a second verify operation using the verify voltage Vcgv (steps S101 and S102). As illustrated in FIG. 3, in the present embodiment, a verify voltage VcgvL which is lower than the verify voltage Vcgv is prepared, in addition to the original verify voltage Vcgv to write "A" level to the memory cell transistor. For example, the verify voltage VcgvL is set to a range which is higher than a read voltage VR and lower than the verify voltage Vcgv. As one example, a voltage difference between the verify voltage Vcgv and the verify voltage VcgvL is set to "0.35V±α". where α represents a margin. Accordingly, VcgVL is set to be: Vcgv−(0.35V±α).

The first verify operation using the verify voltage VcgvL is performed as follows. As illustrated in FIG. 11, the sense amplifier unit 14 applies a voltage Vb1 (Vss<Vb1<Vdd) to all bit lines. For example, the ground voltage Vss is applied to the source line SL.

Subsequently, the row decoder 12 causes the select transistors ST1, ST2 to be in an ON state, in the selected block BLK. Subsequently, the row decoder 12 applies the verify voltage VcgvL to the selected word line, and applies the afore-mentioned read pass voltage Vpass to the non-selected word line.

When the threshold voltage of the memory cell transistor which is a verify target is higher than a verify voltage VcgvL, based on the voltage relationship in the verify operation, a current does not flow through a NAND string. In this case, it is determined that the verify operation is determined to have passed for the verify voltage VcgvL. In contrast, when the threshold voltage of the memory cell transistor which is a verify target is the verify voltage VcgvL or less, a current flows through the NAND string. In this case, the verify operation is determined to have failed for the verify voltage VcgvL.

The second verify operation using the verify voltage Vcgv is carried out in the same manner as the first verify operation using the verify voltage VcgvL, except that a different verify voltage is used.

Subsequently, the controller 20 determines whether or not the overall verify operation has passed, in accordance with the result of two verify operations (step S103). The details of the verify determination operation will be described later. When the overall verify operation is determined to have passed in step S103, the write operation is ended.

When the overall verify operation is determined to have failed in step S103, the write operation is continued. In other words, the controller 20 determines whether or not the write loop count reaches an upper limit value N (step S104).

When the write loop count does not reach the upper limit value N in step S104, the controller 20 steps up the write voltage by a certain step-up voltage (step S105), and thereafter, repeats the write loop. In contrast, when the write loop count reaches the upper limit value N in step S104, the controller 20 ends the write operation.

Verify Determination Operation

Next, the verify determination operation in step S103 of FIG. 10 will be described. As described above, in the present embodiment, the two verify operations including the first verify operation using the verify voltage VcgvL and the second verify operation using the verify voltage Vcgv (>VcgvL), referred to as a multi-level verify operation, is performed.

Figures 12, 13:
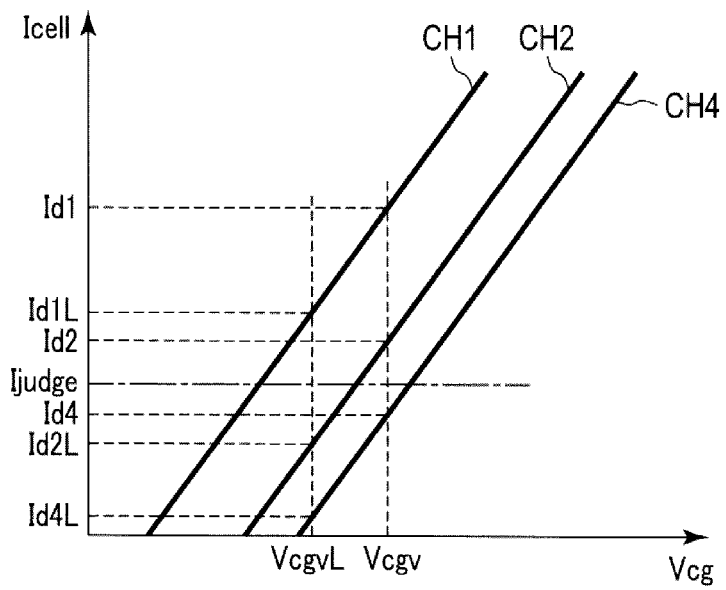
FIG. 12 is a diagram of a verify operation according to the first embodiment.
FIG. 13 is a graph of an I-V characteristic of one type of the memory cell transistor.

FIG. 12 is a diagram of the verify determination operation. In FIG. 12, the cell current in the first verify operation using the verify voltage VcgvL is denoted by IdL, and the cell current in the second verify operation using the verify voltage Vcgv is denoted by Id.

When it is satisfied that "IdL≥Ijudge" and "Id≥Ijudge" as in case 1-1, the controller 20 determines that the overall verify operation has failed, and continues writing. "IdL≥Ijudge" means that the first verify operation using VcgvL has failed, and "Id≥Ijudge" means that the second verify operation using Vcgv has failed. The case 1-1 is applied to, for example, the memory cell transistors (Id1L, Id1) having the I-V characteristic CH1 of FIG. 13.

When it is satisfied that "IdL<Ijudge" and "Id≥Ijudge" as in case 1-2, the controller 20 determines that the overall verify operation has failed, and continues writing. "IdL<Ijudge" means that the first verify operation using VcgvL has passed. The case 1-2 is applied to, for example, the memory cell transistors (Id2L, Id2) having the I-V characteristic CH2 of FIG. 13.

When it is satisfied that "IdL≥Ijudge" and "Id<Ijudge" as in case 1-3, the controller 20 determines that the overall verify has failed, and continues writing. "Id<Ijudge" means that the second verify operation Vcgv has passed. The case 1-3 is applied to, for example, the memory cell transistors (Id3L, Id3) having the I-V characteristic CH3 of FIG. 14.

When it is satisfied that "IdL<Ijudge" and "Id<Ijudge" as in case 1-4, the controller 20 determines that the overall verify has passed, and ends writing. The case 1-4 is applied to, for example, the memory cell transistors (Id3L, Id3) having the I-V characteristic CH4 of FIG. 13.

Figure 14:
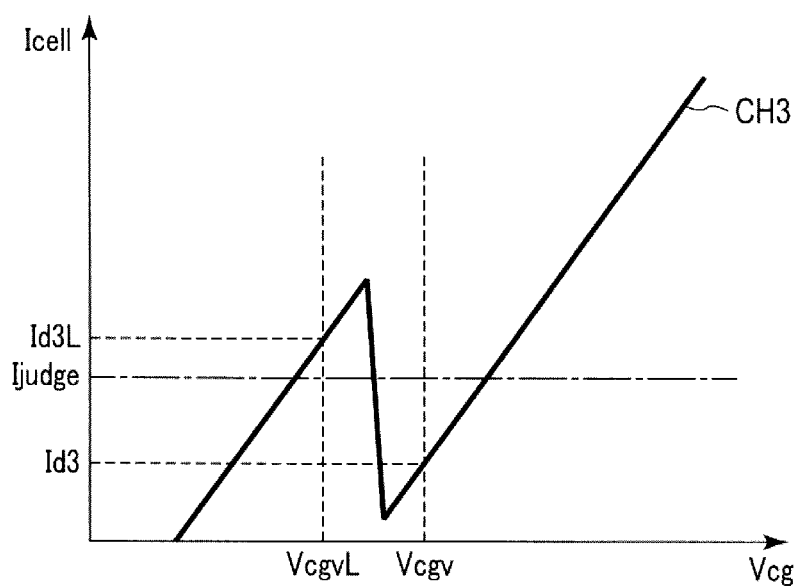
FIG. 14 is a graph of another I-V characteristic of another type of the memory cell transistor.

It is possible to determine that the overall verify operation for the memory cell transistors having the I-V characteristics CH1 to CH3 illustrated in FIG. 13 and FIG. 14 have failed, by using the verify determination operation according to the embodiment.

1-3. Effects of First Embodiment

As described above, in the first embodiment, the controller 20 performs the write operation for applying the write voltage to the selected word line, and the verify operation for verifying the threshold voltage of the memory cell transistor after the write operation. The verify operation includes the first verify operation using the verify voltage VcgvL and the second verify operation using the verify voltage Vcgv (>VcgvL). When both the first and second verify operations have passed, the write operation is ended (because the overall verify operation has passed). In the case of other states (particularly including the case where the first verify operation has failed, and the second verify operation has passed), the writing is continued (because the overall verify operation has failed).

Therefore, according to the first embodiment, it is possible to perform more accurately the verify operation, in other words, it is possible to determine more accurately the threshold voltage of the memory cell transistor. As a result, it is possible to write data to the memory cell transistor more accurately. Thus, it is possible to improve reliability of data of the NAND flash memory 10.

In particular, it is possible to continue writing to the memory cell transistor having the I-V characteristic illustrated in FIG. 14 (memory cell transistor having a current noise). Thus, it is possible to write data to the memory cell transistor having a current noise more accurately.

2. Second Embodiment

A quick pass write (QPW) method is known as a method of narrowing the threshold voltage distribution width after writing, while not increasing the write time. In the QPW-method, an intermediate voltage is applied to the bit line of the memory cell which exceeds a level lower than the original verify level, during the subsequent write operation so as to weaken the intensity of the writing, and thus variations in the threshold voltage are reduced. Thus, it is possible to narrow the threshold voltage distribution width. The second embodiment is an example of an application of the QPW method.

When employing the QPW method in the present embodiment, the verify voltage VcgvL used in the first verify operation is replaced with a verify voltage for QPW. In other words, whether the memory cell is a QPW target or not is determined using the verify voltage VcgvL.

As illustrated in the write operation of FIG. 15, a voltage Vqpw (for example, 1 V) which is slightly higher than the ground voltage Vss is applied to the bit line connected to the memory cell transistor for which the first verify operation has passed. Thus, in the memory cell transistor which is a QPW target, a voltage difference between the word line and the channel is reduced, and the amount of variation in the threshold voltage is reduced (and thus the write speed is slow).

FIG. 16 is a diagram of a verify determination operation according to the second embodiment. In the case of "IdL<Ijudge" and "Id≥Ijudge" as in case 2-2, the controller 20 continues writing, and executes the QPW mode illustrated in FIG. 15.

The operations of the cases 2-1, 2-3, and 2-4 of FIG. 16 are the same as the operations of the cases 1-1, 1-3, and 1-4 of FIG. 12 illustrated in first embodiment.

According to the second embodiment, it is possible to apply the QPW mode to the multi-level verify operation. As a result, it is possible to write data to the memory cell transistor accurately, and the threshold voltage distribution width can be made narrower.

Modification Example

FIG. 17 is a diagram of a verify determination operation according to a modification example of the second embodiment. The modification example of the second embodiment relates to verify determination of the memory cell transistor which is determined as "IdL≥Ijudge" and "Id<Ijudge" as in case 3-3, i.e., the verify determination which assumes the memory cell transistor having the I-V characteristic CH3 of FIG. 14.

In the case of "IdL≥Ijudge" and "Id<Ijudge" as in case 3-3, the controller 20 continues writing, and executes the QPW mode illustrated in FIG. 15. Thus, since the write speed for the memory cell transistor of the case 3-3 is reduced, it is possible to perform more accurate threshold settings, and perform a more accurate write operation.

The operations of the cases 3-1, 3-2, and 3-4 of FIG. 17 are the same as the operation of the cases 2-1, 2-2, and 2-4 of FIG. 16 illustrated in the second embodiment.

Further, in the respective embodiments, the multi-level verify operation may change the sensing time, while using the verify voltage as the same voltage, in the first verify operation using the verify voltage VcgvL and the second verify operation using the verify voltage Vcgv. Specifically, a first sensing time for first verify operation is shorter than a second sensing time for the second verify operation. The sensing time is a time elapsed from the start of discharging of the bit line. Thus, the same determination operation can be realized as in the multi-level verify operation using two types of verify voltages.

The respective embodiments can be applied to a three-dimensional stacked NAND flash memory in which multiple memory cells are stacked on the semiconductor substrate. Such a configuration of the memory cell array is described in, for example, U.S. patent application Ser. No. 12/407,403, filed on Mar. 19, 2009, entitled "three-dimensional stacked non-volatile semiconductor memory," in U.S. patent application Ser. No. 12/406,524, filed on Mar. 18, 2009, entitled "three-dimensional stacked non-volatile semiconductor memory," in U.S. patent application Ser. No. 12/679,991, filed on Mar. 25, 2010, entitled "non-volatile semiconductor memory device and manufacturing method thereof," and in U.S. patent application Ser. No. 12/532,030, filed on Mar. 23, 2009, entitled "semiconductor memory and manufacturing method thereof." All of these patent applications are incorporated by reference herein in their entirety.

The erasing of data may be executed in a unit smaller than the block BLK. The erase method is described in U.S. patent application Ser. No. 13/235,389, filed on Sep. 18, 2011, entitled "non-volatile semiconductor memory device," in U.S. patent application Ser. No. 12/694,690, filed on Jan. 27, 2010, entitled "non-volatile semiconductor storage device," and in U.S. patent application Ser. No. 13/483,610, filed on May 30, 2012, entitled "non-volatile semiconductor memory device and data erase method thereof." All of these patent applications are incorporated by reference herein in their entirety.

When one memory cell transistor MT holds two bit data, the threshold voltage has one of four types of levels depending on the stored data. If the four types of levels are an erase level, an A level, a B level, and a C level, in an ascending order, the voltage applied to the select word line during an A-level read operation is, for example, in a range of 0 V to 0.55 V. Without being limited thereto, the voltage may be in any one of ranges 0.1 V to 0.24 V, 0.21 V to 0.31 V, 0.31 V to 0.4 V, 0.4 V to 0.5 V, 0.5 V to 0.55 V, and the like. The voltage applied to the selected word line during a B-level read operation is, for example, in a range of 1.5 V to 2.3V. Without being limited thereto, the voltage may be in any one of ranges of from 1.65 V to 1.8 V, from 1.8 V to 1.95 V, from 1.95 V to 2.1 V, from 2.1 V to 2.3 V, and the like. The voltage applied to the selected word line during a C-level read operation is, for example, in a range of from 3.0 V to 4.0 V. Without being limited thereto, the voltage may be in any one of ranges of from 3.0 V to 3.2 V, from 3.2 V to 3.4 V, from 3.4 V to 3.5 V, from 3.5 V to 3.6 V, from 3.6 V to 4.0 V, and the like. A time (tR) of the read operation may be, for example, in any one of ranges of from 25 μs to 38 μs, from 38 μs to 70 μs, from 70 μs to 80 μs, and the like.

A write operation includes a program and a program verify operation. In the write operation, a voltage that is first applied to the word line, which is selected during the program is, for example, in a range of from 13.7 V to 14.3 V. Without being limited thereto, the voltage may be in any one of ranges, for example, from 13.7 V to 14.0 V, from 14.0 V to 14.6 V, and the like. A voltage that is first applied to the word line, which is selected during writing to the odd-numbered word line and a voltage that is first applied to the word line, which is selected during writing to the even-numbered word line may be different. When the program operation is executed by an incremental step pulse program (ISPP) method, an example of a step-up voltage is about 0.5 V, or the like. The voltage applied to the non-selected word line may be in a range of, for example, from 6.0 V to 7.3 V. Without being limited thereto, the voltage may be in a range of, for example, from 7.3 V to 8.4V, or may be 6.0 V or less. The pass voltage to be applied may be changed depending on whether the non-selected word line is an odd-numbered word line or an even-numbered word line. A time (tProg) of the write operation may be, for example, in a range of from 1,700 µs to 1,800 µs, from 1,800 µs to 1,900 µs, or from 1,900 µs to 2,000 µs.

In the erase operation, a voltage that is first applied to the well, which is arranged on the top of the semiconductor substrate and above which the memory cell is arranged, is for example, in a range of from 12 V to 13.6 V. Without being limited thereto, the voltage may be in any one of ranges of, for example, from 13.6 V to 14.8 V, from 14.8 V to 19.0 V, from 19.0 V to 19.8 V, from 19.8 V to 21 V, and the like. A time (tErase) of the erase operation may be, for example, in a range of from 3,000 µs to 4,000 µs, from 4,000 µs to 5,000 µs, or from 4,000 µs to 9,000 µs.

Further, the memory cell may have, for example, the following structure. The memory cell includes a charge storage film which is arranged on the semiconductor substrate such as a silicon substrate, through a tunnel insulating film having a film thickness of from 4 nm to 10 nm. The charge storage film can have a stacked structure of an insulating film such as a silicon nitride (SiN) film or a silicon oxy nitride (SiON) film having a film thickness of from 2 nm to 3 nm and polysilicon (Poly-Si) film having a film thickness of from 3 nm to 8 nm. Metal such as ruthenium (Ru) may be added to the polysilicon film. The memory cell includes an insulating film on the charge storage film. The insulating film includes a silicon oxide ($SiO_x$) film having a film thickness of from 4 nm to 10 nm which is interposed between a lower layer High-k film having a film thickness of from 3 nm to 10 nm and an upper layer High-k film having a film thickness of from 3 nm to 10 nm. Examples of the material of the High-k film are hafnium oxide (HfO) or the like. Further, the film thickness of the silicon oxide film can be made thicker than the film thickness of the High-k film. A control electrode having a film thickness of from 30 nm to 70 nm is provided on the insulating film, through a film having a thickness of 3 nm to 10 nm. Such a film is for example, a metal oxide film such as tantalum oxide (TaO), a metal nitride film such as tantalum nitride (TaN), or the like. Tungsten (W) or the like can be used for the control electrode. It is possible to form an air gap between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell that includes a charge storage layer;
a word line connected to a gate of the memory cell; and
a controller configured to perform a write operation on the memory cell by applying a write voltage to the word line to shift a threshold voltage of the memory cell, the write operation including a verify operation on the memory cell after the applying of the write voltage to verify that the threshold voltage of the memory cell is at least a target value after the write operation,
wherein the verify operation includes a first verify operation using a first verify voltage applied to the word line and a second verify operation after the first verify operation using a second verify voltage applied to the word line, the second verify voltage being higher than the first verify voltage, and the controller is configured to increase the write voltage when the first verify operation fails and the second verify operation passes.

2. The device according to claim 1,
wherein the write voltage is increased by the controller if the second verify operation has failed.

3. The device according to claim 2,
wherein the write voltage is increased if the first verify operation has passed and the second verify operation has failed.

4. The device according to claim 3, further comprising:
a bit line connected to the memory cell,
wherein the controller is configured to apply a third voltage to the bit line in the write operation when the first and second verify operations have failed, and
wherein the controller is configured to apply a fourth voltage that is higher than the third voltage to the bit line in the write operation when the first verify operation has passed and the second verify operation has failed.

5. The device according to claim 3, further comprising:
a bit line that is connected to the memory cell,
wherein the controller is configured to apply a third voltage to the bit line in the write operation when the first and second verify operations have failed, and
to apply a fourth voltage that is higher than the third voltage to the bit line in the write operation when the first verify operation has failed and the second verify operation has passed.

6. The device according to claim 1,
wherein the write operation is ended if both the first and second verify operations have passed.

7. The device according to claim 1, further comprising:
a status register that stores an indication of whether or not the write operation has completed successfully, wherein
the controller stores the indication that the write operation has completed successfully in the status register only if both the first verify operation and the second verify operation have passed.

8. The device according to claim 1, wherein the second verify voltage is higher than the first verify voltage by about 0.35V.

9. A semiconductor memory device, comprising:
a memory cell that includes a charge storage layer;

a word line that is connected to a gate of the memory cell; and a controller configured to:
apply a first write voltage to the word line to shift a threshold voltage of the memory cell to a target threshold voltage,
apply a first verify voltage to the word line in a first verify operation to determine whether the threshold voltage of the memory cell is at or above the first verify voltage,
apply a second verify voltage higher than the first verify voltage to the word line in a second verify operation to determine whether the threshold voltage of the memory cell is at or above the second verify voltage, and
apply a second write voltage higher than the first write voltage to the word line to shift the threshold voltage of the memory cell to the target threshold voltage if the first verify operation fails and the second verify operation passes.

10. The device according to claim 9, wherein the second verify voltage is higher than the first verify voltage by about 0.35V.

11. The semiconductor memory device according to claim 9, wherein the controller is further configured to:
apply the second write voltage to the word line to shift the threshold voltage of the memory cell to the target threshold voltage if the first verify operation passes and the second verify operation fails.

12. A method of writing data into a memory cell of semiconductor memory device, wherein the memory cell includes a charge storage layer and a gate that is connected to a word line, said method comprising:
applying a first write voltage to a word line to shift a threshold voltage of memory cell to a target threshold voltage;
applying a first verify voltage to the word line in a first verify operation to determine whether that the threshold voltage of the memory cell after the applying of the first write voltage is at or above the first verify voltage; and
applying a second verify voltage higher than the first verify voltage to the word line in a second verify operation to determine whether the threshold voltage of the memory cell is at or above the second verify voltage, and
applying a second write voltage higher than the first write voltage to the word line to shift the threshold voltage of the memory cell to the target threshold voltage if the first verify operation fails and the second verify operation passes.

13. The method according to claim 12, further comprising:
updating a status register to indicate writing of data to the memory cell is complete when the first and second verify operations have passed.

14. The method according to claim 12, further comprising:
applying the second write voltage to the word line to shift the threshold voltage of the memory cell to the target threshold voltage if the first verify operation passes and the second verify operation fails.

* * * * *